(12) United States Patent
Sun et al.

(10) Patent No.: US 10,200,038 B2
(45) Date of Patent: Feb. 5, 2019

(54) BOOTSTRAPPING CIRCUIT AND UNIPOLAR LOGIC CIRCUITS USING THE SAME

(71) Applicant: Yale University, New Haven, CT (US)

(72) Inventors: Xaio Sun, New Haven, CT (US); Tso-Ping Ma, Branford, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 15/316,007

(22) PCT Filed: May 29, 2015

(86) PCT No.: PCT/US2015/033155
§ 371 (c)(1),
(2) Date: Dec. 2, 2016

(87) PCT Pub. No.: WO2015/187482
PCT Pub. Date: Dec. 10, 2015

(65) Prior Publication Data
US 2017/0111046 A1   Apr. 20, 2017

Related U.S. Application Data

(60) Provisional application No. 62/007,064, filed on Jun. 3, 2014.

(51) Int. Cl.
*H03K 3/356* (2006.01)
*H03K 19/017* (2006.01)
*H03K 19/094* (2006.01)

(52) U.S. Cl.
CPC . *H03K 19/01714* (2013.01); *H03K 3/356113* (2013.01); *H03K 19/094* (2013.01)

(58) Field of Classification Search
None
See application file for complete search history.

(56) References Cited

U.S. PATENT DOCUMENTS

| | | | |
|---|---|---|---|
| 4,038,567 A | 7/1977 | Lewis | |
| 4,689,763 A | 8/1987 | Fang | |
| 8,384,156 B2 | 2/2013 | Ma et al. | |
| 2006/0261846 A1* | 11/2006 | Twigg | H03K 19/173 326/37 |
| 2008/0258770 A1 | 10/2008 | Van Acht et al. | |
| 2011/0033022 A1 | 2/2011 | Zebedee et al. | |
| 2011/0090184 A1* | 4/2011 | Yamazaki | G09G 3/20 345/204 |
| 2017/0070220 A1* | 3/2017 | Yoshida | H03K 17/691 |

OTHER PUBLICATIONS

PCT Search Report and Written Opinion dated Aug. 21, 2015 for PCT/US2015/033155.
U.S. Appl. No. 62/007,064, filed Jun. 3, 2014.

* cited by examiner

*Primary Examiner* — Lincoln Donovan
*Assistant Examiner* — Khareem E Almo
(74) *Attorney, Agent, or Firm* — McCarter & English, LLP

(57) ABSTRACT

Exemplary embodiments of the present disclosure are directed to a bootstrapping module and logic circuits utilizing the bootstrapping module to compensate for a weak high condition. The bootstrapping module can be implemented using transistors have a single channel type that is the same as the channel type of transistors utilized in the logic circuits such that a truly unipolar circuit can be realized while addressing the weak high problem of such unipolar circuits.

24 Claims, 12 Drawing Sheets

BOOTSTRAPPING CIRCUIT AND UNIPOLAR LOGIC CIRCUITS USING THE SAME

CROSS REFERENCE TO RELATED APPLICATIONS

This application claims priority to U.S. Provisional Application No. 62/007,064, filed on Jun. 3, 2014, the disclosure of which is incorporated herein by reference in its entirety.

GOVERNMENT LICENSE RIGHTS

This invention was made with government support under Grant No. 1383897 awarded by the Sandia National Laboratory. The government has certain rights in the invention.

TECHNICAL FIELD

Exemplary embodiments of the present disclosure relate to a bootstrapping circuit configured to compensate for a weak high problem in unipolar logic circuits, and unipolar logic circuits implemented with the bootstrapping circuit.

BACKGROUND

The building block for the conventional Complementary Metal-Oxide-Semiconductor (CMOS) technology consists of N-channel Metal-Oxide-Semiconductor Field-Effect Transistors (NMOSFETs) and P-channel Metal-Oxide-Semiconductor Field-Effect Transistors (PMOSFETs). The NMOSFETs and PMOSFETs are normally in a nonconductive state (e.g., an off state) when a gate voltage of the transistors does not exceed a gate threshold value. To operate a MOSFET in a conductive state (e.g., an on state), a sufficiently large gate threshold voltage (Vth) typically needs to be applied to a gate electrode of the MOSFET (e.g., relative to a voltage of the source electrode of the MOSFET). Normally, Vth is positive for NMOSFETs, and negative for PMOSFETs.

Typically, the drive current of either the NMOSFET or the PMOSFET is approximately proportional to its carrier mobility ($\mu$) and channel width (W). Since the mobility of electrons ($\mu e$) is different from the mobility of holes ($\mu p$) for a given semiconductor material, the width of the PMOSFET (Wp) is often different than that the width (Wn) of the NMOSFET in CMOS circuits so that each transistor is designed to produce the same amount of current in the CMOS circuit. More specifically, the Wp/Wn ratio is typically set to be the mobility ratio of $\mu e/\mu p$ for the purpose of current matching in CMOS circuits. For example, to achieve current matching in silicon-based CMOS logic circuits, the width of the PMOSFET is typically 2-3 times that of the NMOSFET, corresponding to the $\mu e/\mu p$ ratio of silicon, for current matching. However, even with adjusted widths, the speed of a CMOS circuit is ultimately limited by the transistors in the circuit with lower carrier mobility, as the large width will also increase the load capacitances in cascaded logic gates, and hence reduce the overall speed.

For semiconductor materials that have a large gap between $\mu e$ and $\mu p$ values, the speed of the CMOS circuit is limited by the $\mu$ having the lowest value, and the drain current to pull-up and pull-down does not match unless an unrealistically large width ratio is applied. Unfortunately, the imbalance between $\mu e$ and $\mu p$ is common in those emerging semiconductor substrates to replace Si, as shown in Table I below. Moreover, some special semiconductor substrates, such as InGaZnO, CdSe, carbon nanotube (CNT), and 2D transition metal dichalcogenides (TMDs), do not have complementary-type doping for CMOS circuits (i.e., do not support NMOSFET AND PMOSFET devices). Thus, for these channel materials, unipolar logic is the only realistic option since unipolar logic circuits incorporate either N-type devices or P-type devices, but not both.

TABLE I shows the electron and hole mobility for a number of semiconductors, indicating large $\mu_n/\mu_p$ ratios for many of them.

|  | Si | Ge | GaAs | $In_{0.53}Ga_{0.47}As$ | InAs |
|---|---|---|---|---|---|
| Eg (eV) | 1.1 | 0.66 | 1.4 | 0.75 | 0.35 |
| $\mu_n$ (cm²/v-s) | 1,350 | 3,900 | 4,600 | 7,800 | 40,000 |
| $\mu_p$ (cm²/v-s) | 480 | 1,900 | 500 | 350 | <500 |
| m*/m$_o$ | 0.165 | 0.12 | 0.067 | 0.041 | 0.024 |

Conventional unipolar logic circuits often include depletion load NMOS (or PMOS) logic and/or pass-gate logic with various swing restoration techniques. Depletion load NMOS logic can have high static power consumption, which can be undesirable for many application. Pass-gate logic circuits are often only pseudo-unipolar as they tend to rely on CMOS circuits including both NMOSFET and PMOSFET devices to achieve full swing, which adds cost and complexity to the design of logic circuits.

All-N-channel CMOS logic circuits (i.e. unipolar logic circuits) have been developed some of which are described in U.S. Pat. No. 8,384,156, the disclosure of which is incorporated by reference herein in its entirety. Similar unipolar logic circuits can be recognized using only on PMOSFETs device. In unipolar logic circuits, transistors of the same type (i.e., either NMOSFETs or PMOSFETs) are used to both pull up and pull down output voltage levels, but the gates of the pull-up and pull-down transistors are driven complementary inputs.

It has been recognized that a "weak-high" problem exists in unipolar logic circuits when a NMOSFET (or PMOSFET) is used to pull up (or down) the voltage level. The weak high problem can also be characterized as Vth-loss problem because the resulting output voltage is typically at best Vdd-Vth for NMOSFET unipolar logic circuits (or Ground+ Vth for PMOSFET unipolar logic circuits), which is a |Vth| below a desired voltage level for a NMOSFET unipolar logic circuit or a |Vth| above a desired voltage level for PMOSFET unipolar logic circuits. Conventional pass gate logic circuits often adapt conventional CMOS circuits at an output stage of the logic to recover the output levels to overcome the weak high problem. In doing so, such conventional pass gate logic circuits include both N-type and P-type devices and, therefore, are no longer unipolar circuits.

SUMMARY

To overcome the weak high problem, and realize truly unipolar logic circuits, exemplary embodiments of the present disclosure include a unipolar bootstrapping circuit that can be integrated into and/or discretely coupled to unipolar logic circuits. Unlike conventional approaches to addressing the weak high problem, such as using "always-on" devices (such as depletion mode transistors), requiring both P-channel and N-channel transistors (100% unipolar), or using dynamic circuits (e.g., CLK controlled transistors), exemplary embodiments of the present disclosure use transistors having the same channel type as the logic circuit. Simulated results indicate that unipolar logic circuits that utilize exemplary embodiments of the bootstrapping circuit can have performance advantages over the conventional CMOS logic when the imbalance between electron and hole mobility is over a factor of 4.

Exemplary embodiments of the bootstrapping circuit of the present disclosure can be utilized with many types of unipolar-logic-style circuits, such as the U-CMOS logic and pass gate logic and do not use conventional CMOS circuits to recover the Vth loss. Therefore, logic circuits that include exemplary embodiments of the bootstrapping circuit can be completely unipolar. When the resulting unipolar circuits include channel materials (e.g. flexible thin-films, TMDs, CNT, etc.) that cannot be used to make complementary transistors (e.g., NMOSFET and PMOSFET), a significant reduction of stand-by power can be achievable compared to the depletion-mode NMOS (or PMOS) logic.

In accordance with embodiments of the present disclosure, a bootstrapping module for a dual-rail unipolar logic circuit is disclosed. The bootstrapping module includes a first pull-up transistor having a first terminal electrically coupled to a first power rail, a second terminal, and a third terminal that is capacitively coupled to the second terminal. The bootstrapping module also includes a latch circuit electrically coupled to the second terminal to control a voltage at the second terminal based on a voltage at the third terminal.

In accordance with embodiments of the present disclosure, a logic circuit is disclosed that includes a logic module and a bootstrapping module. The logic module is configured to output a logic value at a first circuit node in response to one or more input values. The bootstrapping module is capacitively coupled to the first circuit node and contributes to a voltage at the first circuit node based on the logic value being output by the first logic module. The logic module and the bootstrapping module include a plurality of transistors, each of the plurality of transistors having a single channel type (e.g., NMOSFET or PMOSFET).

In accordance with embodiments of the present disclosure, an integrated circuit is disclosed that includes a unipolar logic circuit and a bootstrapping module. The unipolar logic circuit includes a first plurality of transistors of a single channel type and has a first circuit node and a second circuit node. The first and second circuit nodes are configured to provide complementary logic values in response to a set of input signals. The bootstrapping module includes a second plurality of transistors of the single channel type (e.g., NMOSFET or PMOSFET). The bootstrapping module is capacitively coupled to the first and second nodes and is configured to contribute to a voltage at the first circuit node based on the complementary logic values at the first and second nodes.

The bootstrapping module can include a first pull-up transistor and a second pull-up transistor. The first pull-up transistor can have a first terminal electrically coupled to a first power rail, a second terminal, and a third terminal that is capacitively coupled to the second terminal and electrically coupled to the first circuit node. The second pull-up transistor can have a first terminal electrically coupled to a voltage supply, a second terminal, and a third terminal that is capacitively coupled to the second terminal and electrically coupled to the second circuit node, the second pull-up transistor being arranged in a parallel circuit configuration with the first pull-up transistor.

The bootstrapping module can also include a latch circuit electrically coupled to the second terminals of the first and second pull-up transistors to control a voltage at the second terminals. The latch circuit can include a first pull-down transistor and a second pull-down transistor. The first pull-down transistor having a first terminal, a second terminal, and a third terminal. The first terminal of the first pull-down transistor is electrically coupled to the second terminal of the first pull-up transistor. The second terminal of the first pull-down transistor is electrically coupled to a second power rail. The third terminal is electrically coupled to the second terminal of the second pull-up transistor. The second pull-down transistor can have a first terminal, a second terminal, and a third terminal. The first terminal of the second pull-down transistor is electrically coupled to the second terminal of the second pull-up transistor. The second terminal of the second pull-down transistor is electrically coupled to the second power rail. The third terminal of the second pull-down transistor is electrically coupled to the second terminal of the first pull-up transistor.

The logic modules or circuits described herein can include at least one of a logic NAND gate, a logic AND gate, a logic OR gate, a logic NOR gate, an exclusive OR gate, or an exclusive NOR gate.

Any combination and permutation of embodiments is envisioned. Other objects and features will become apparent from the following detailed description considered in conjunction with the accompanying drawings. It is to be understood, however, that the drawings are designed as an illustration only and not as a definition of the limits of the present disclosure.

BRIEF DESCRIPTION OF THE DRAWINGS

Exemplary embodiments of the present disclosure will be understood from the following detailed description when read with the accompanying Figures. In the drawings, like reference numerals refer to like parts throughout the various views of the non-limiting and non-exhaustive embodiments of the present invention, and wherein.

DETAILED DESCRIPTION

Exemplary embodiments of the present disclosure realize truly unipolar logic-style circuits overcoming the "weak high" or "Vth-loss" problem of conventional unipolar logic-style circuits. Exemplary embodiments include a bootstrapping circuit block that can be integrated into unipolar logic-style circuits including U-CMOS circuits, pass gate logic circuits, as well as other dual-rail logic style circuits. Exemplary unipolar logic-style circuits of the present disclosure can include dual-rail logic trees (e.g., in U-CMOS style or pass gate logic style, etc.) and the bootstrapping circuit block, which can include pull-up transistors and pull-down transistors that form a latch. The bootstrapping block enables building the unipolar logic circuits without being hindered by the threshold voltage loss problem and exemplary embodiments of the unipolar logic circuits with bootstrapping blocks described herein, can be advantageously formed using various channel materials to take advantage of a high mobility or other attributes of the channel materials, such as low dimensionality, flexibility, and the like.

In accordance with exemplary embodiments of the present disclosure, logic blocks of the logic circuits described herein connect to the bootstrapping blocks only at their outputs. Therefore, the bootstrapping block can be readily integrated with any type of dual-rail-logic circuits. The bootstrapping circuit design can utilize complementary output signals from a logic circuit to control when the bootstrapping circuit contributes (i.e. boosts) the voltage at the circuit nodes corresponding to one of the complementary outputs based on logic values being output by the complementary outputs.

Figure 1:
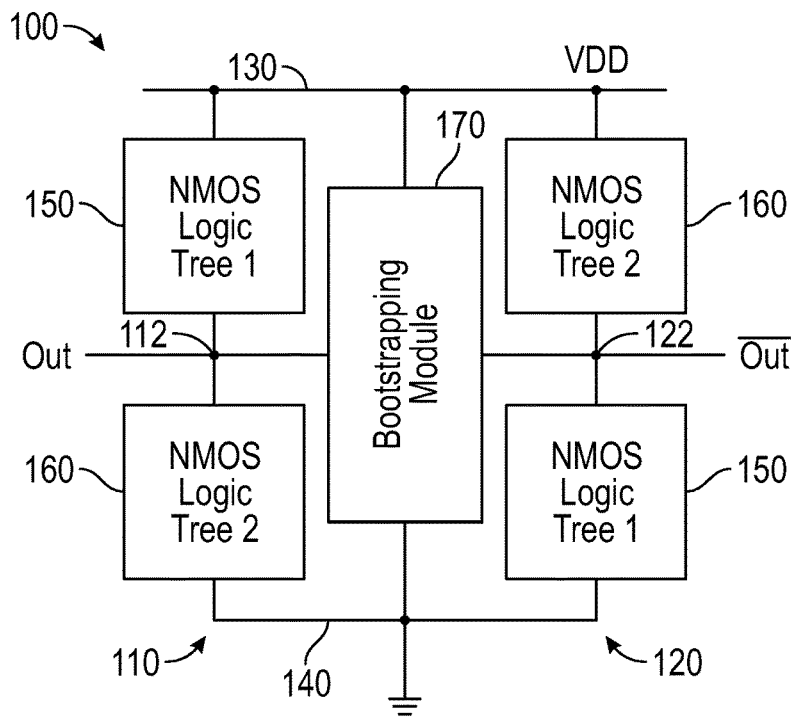
FIG. 1 is a block diagram of a unipolar logic circuit in accordance with exemplary embodiments of the present disclosure.

FIG. 1 is a block diagram of an exemplary logic circuit 100 in accordance with exemplary embodiments. The logic circuit 100 can be an integrated circuit or can be formed by discrete circuit elements and can be formed using one or more semiconductor materials, such as, for example, any of the materials provided in Table 1 above and/or can be formed using CdSe, carbon nanotubes, 2D transition metal dichalcogenides, and the like. The logic circuit 100 is an all N-channel CMOS logic circuit or an all P-channel CMOS logic circuit (i.e. unipolar logic circuits) such that the logic circuit can be formed from either N-channel MOSFETs (NMOSFETs) or P-channel MOSFETs (PMOSFETs), but not both. At least some of the MOSFETs that form the logic circuit 100 can be configured to pull up or pull down output voltage levels based on input signals to the logic circuit as described herein.

The logic circuit 100 can include circuit legs 110 and 120. The legs 110 and 120 can receive power from a positive power source having a voltage, Vdd, which can be electrically coupled to the legs 110 and 120 by a power rail 130. Likewise, the legs 110 and 120 can be connected to ground, GND, as shown in FIG. 1 (or an voltage supply having a voltage that is less than Vdd), which can be electrically coupled to the legs 110 and 120 by a power rail 140. This configuration with power rails 130 and 140 is referred to herein as a dual rail circuit such that the logic circuit 100 can be referred to herein as a dual-rail logic circuit. The circuit leg 110 can be arranged to generate an output signal, OUT, at a circuit node 112 in response to electrical input signal(s) input to the circuit leg 110, and the circuit leg 120 can be arranged to generate a complementary output signal, $\overline{OUT}$, at a circuit node 122 in response to the electrical input signal(s) input to the circuit leg 120.

The circuit legs 110 and 120 can include instances of logic trees 150 and 160, which may also be referred to herein as logic blocks or elements. For the leg 110, the logic trees 150 and 160 can be electrically coupled to form a circuit between the power rails 130 and 140, in which the logic tree 150 is electrically coupled to the power rail 130 and the node 112, and the logic tree 160 is electrically coupled to the node 112 and the power rail 140. To generate a high output signal at the node 112 corresponding to a logic '1' (e.g., OUT≈Vdd), an input to the logic trees can drive the logic trees 150 and 160 of the leg 110 such that the logic tree 150 provides a conductive path from the node 112 to the power rail 130 to "pull-up" the node 112 so that the voltage at the node 112 is approximately the voltage applied to the power rail 130 (e.g., Vdd). To generate a low output signal at the node 112 corresponding to a logic '0' (e.g., OUT≈GND), an input to the logic trees can drive the logic trees 150 and 160 of the leg 110 such that the logic tree 160 provides a conductive path from the node 112 to the power rail 140 to "pull-down" the node 112 so that the voltage at the node 112 is approximately the voltage applied to the power rail 140 (e.g., GND).

For the leg 120, the logic trees 150 and 160 can be electrically coupled to form a circuit between the power rails 130 and 140, in which the logic tree 160 is electrically coupled to the power rail 130 and the node 122, and the logic tree 150 is electrically coupled to the node 122 and the power rail 140. To generate a high output signal at the node 122 corresponding to a logic '1' (e.g., $\overline{OUT}$≈Vdd), an input to the logic trees can drive the logic trees 150 and 160 of the leg 120 such that the logic tree 160 provides a conductive path from the node 122 to the power rail 130 to "pull-up" the node 122 so that the voltage at the node 122 is approximately the voltage applied to the power rail 130 (e.g., Vdd). To generate a low output signal at the node 122 corresponding to a logic '0' (e.g., $\overline{OUT}$≈GND), an input to the logic trees can drive the logic trees 150 and 160 of the leg 120 such that the logic tree 150 provides a conductive path from the node 122 to the power rail 140 to "pull-down" the node 122 so that the voltage at the node 122 is approximately the voltage applied to the power rail 140 (e.g., GND).

In exemplary embodiments, the logic trees 150 of the legs 110 and 120 can be configured to be driven by a first set of input signals, and the logic trees 160 of the legs 110 and 120 can be configured to be driven by a second set of input signals that are complementary to the first set of input signals. For example, if the logic trees 150 are driven by an input signal corresponding to a logic '1', the logic trees 160 are driven by a complementary input signal corresponding to a logic '0' to facilitate generating complementary output signals OUT and OUT at the nodes 112 and 122, respectively. The logic trees 150 and 160 can be formed by one or more Metal Oxide Semiconductor Field Effect Transistors (MOSFETS). The MOSFETS that form the logic trees 150 and 160 are either n-channel MOSFETS (NMOSFETS) or p-channel MOSFETS (PMOSFET) such that the instances of the logic trees 150 and 160 form portions of a unipolar CMOS logic circuit.

As shown in FIG. 1, a bootstrapping circuit or module 170 can be electrically coupled to the power source and ground, and can be electrically coupled to the nodes 112 and 122. The bootstrapping module 170 is responsive to the voltage at the nodes 112 and 122 to increase or decrease the voltage at the nodes 112 and 122. For example, if the node 112 is being pulled up by the logic tree 150 of the leg 110 and the node 122 is being pulled down by the logic tree 150 of the leg 120, the bootstrapping circuit can operate to increase or "boost" the voltage at the node 112 and decrease the voltage at the node 122. If the logic circuit 100 was devoid of the bootstrapping module 170, a "weak-high" problem would or Vth-loss problem would exist because the resulting output voltage at either node 112 or 122 would be less than the voltage Vdd applied to the power rail 130 when either of these nodes are being pulled and because the resulting output voltage at either node 112 or 122 would be greater than the voltage GND applied to the power rail 140 when either of these nodes are being pulled down. The bootstrapping module 170 overcomes the weak high problem by compensating voltages at the nodes 112 and 122 as described herein.

Figure 2:
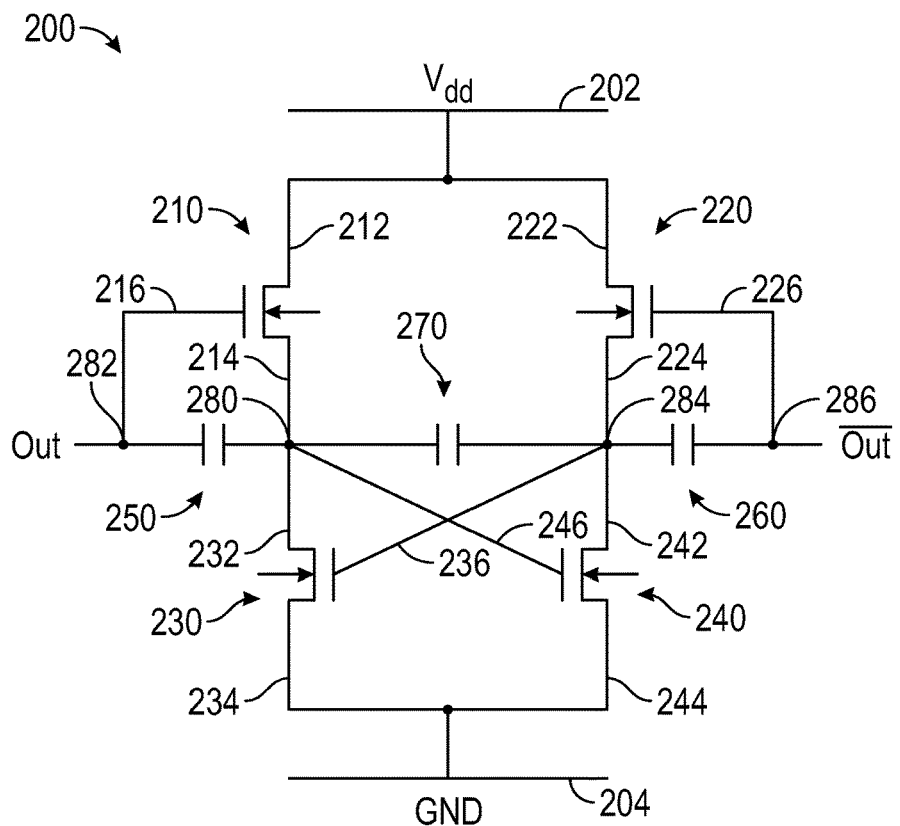
FIG. 2 is a circuit diagram of an exemplary embodiment of a bootstrapping circuit in accordance with the present disclosure.

FIG. 2 is a circuit diagram of an exemplary embodiment of a bootstrapping module 200 that can be implemented in accordance with the present disclosure to compensate for weak high or Vth-loss problems in unipolar logic circuits. The bootstrapping module 200 can include transistors 210, 220, 230, and 240, and capacitors 250 and 260. In some embodiments, a capacitor 270 can be included in the bootstrapping module 200. In the present embodiment, the transistors can be NMOSFETs, although on skilled in the art will recognize that in other embodiments, the transistors 210, 220, 230, and 240 can be PMOSFETs.

The transistor 210 can include a drain terminal 212, a source terminal 214, and a gate terminal 216. The drain terminal 212 can be electrically coupled to a power rail 202, the source terminal 214 can be electrically coupled to a circuit node 280, and the gate terminal 216 can be electrically connected to a node 282. The capacitor 250 can be electrically coupled between the nodes 280 and 282.

The transistor 220 can include a drain terminal 222, a source terminal 224, and a gate terminal 226. The drain terminal 222 can be electrically coupled to a power rail 202, the source terminal 224 can be electrically coupled to a circuit node 284, and the gate terminal 226 can be electrically connected to a node 286. The capacitor 260 can be electrically coupled between the nodes 284 and 286.

The transistor 230 can include a drain terminal 232, a source terminal 234, and a gate terminal 236. The drain terminal 232 can be electrically coupled to the node 280, the source terminal 234 can be electrically coupled to a power rail 204, and the gate terminal 236 can be electrically connected to the node 284.

The transistor 240 can include a drain terminal 242, a source terminal 244, and a gate terminal 246. The drain terminal 242 can be electrically coupled to the node 284, the source terminal 244 can be electrically coupled to a power rail 204, and the gate terminal 246 can be electrically connected to the node 280.

In exemplary embodiments, the nodes 282 and 286 of the bootstrapping module can be electrically coupled to the output nodes of a logic circuit (e.g., nodes 112 and 122) such that the bootstrapping module 200 can compensate an output voltage for the logic circuit. For embodiments that include the capacitor 270, the capacitor 270 can be disposed between the nodes 280 and 284. The transistors 210 and 220 are pull-up transistors that can be turned based on the voltage at the nodes 282 and 286, respectively, to pull-up the nodes 280 and 284, respectively. The transistors 210 and 220 are generally not in the ON state simultaneously, although there may be a transient period of time when transition from one logic value to another that both of the transistors 210 and 220 are on. The transistors 230 and 240 are pull-down transistors and form a latch for the bootstrapping circuit such that after the latch is triggered, at least one of the pull-up transistors 210 or 220 contribute to the voltage at the nodes 282 and 286, respective.

The bootstrapping module 200 is configured to overcome the "weak high" or "Vth-loss" problem of conventional unipolar logic circuits (U-CMOS or unipolar pass-gate circuits). In an exemplary operation, when the node 282 is driven to a high voltage (i.e. to a logic '1') by, for example, a pull-up transistor of a logic circuit and the node 286 is driven to a low voltage (i.e. a logic '0') by, for example, a pull-down transistor of a logic circuit, the voltage at the node 282 reaches a voltage of Vdd-Vth and the node 282 is floating. The transistor 210 of the bootstrapping module 200 is subsequently turned on due to the voltage at the node 282 (e.g., the gate-to-source voltage of the transistor 210 exceeds the threshold voltage of the transistor 210, and the transistor 230 is turned off as its gate terminal 236 receives a low voltage (logic '0') from the node 284 to trigger the latch. As electrical current flows into the node 280 through transistor 210, the voltage level at the node 280 increases and drives the gate 246 of the transistor 240 to turn the transistor 240 on (e.g., the gate-to-source voltage of the transistor 240 exceeds the threshold voltage of the transistor 240). The voltage level at node 284 decreases and turns off the transistor 230 (i.e. the gate-to-source voltage of the transistor 230 is less than the threshold voltage of the transistor 230). The above described process provides a time delay for increasing the voltage level at the node 280 based on the latching mechanism implemented by the transistors 230 and 240.

As the transistor 230 is turned off, the voltage level at the node 280 is pulled up to be at least Vdd-2Vth. During the rise in voltage at the node 280, the voltage at the node 282 is boosted to a value that is higher than Vdd-Vth due to the capacitive coupling between 282 and 280 through the capacitor 250. Similar operation occurs when node 286 is pulled-up by a transistor of a logic circuit and the node 282 is pulled-down by a transistor in a logic circuit.

Figure 3:
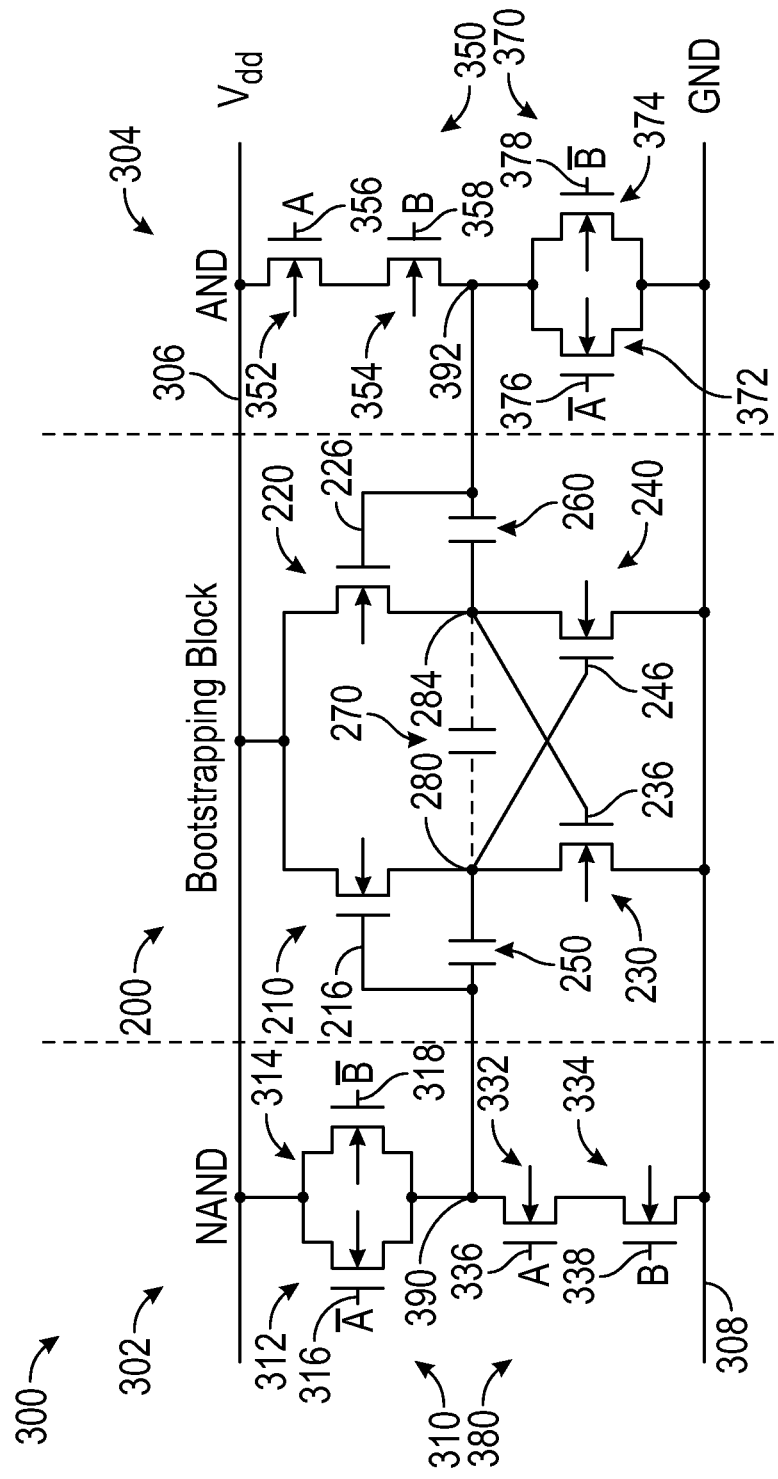
FIG. 3 is a circuit diagram of an exemplary embodiment of a NAND/AND logic circuit including an exemplary bootstrapping circuit in accordance with the present disclosure.

FIG. 3 is a circuit diagram of a U-CMOS logic circuit 300 in accordance with exemplary embodiments of the present disclosure. The logic circuit 300 includes a NAND logic circuit portion (NAND portion) 302, an AND logic circuit portion (AND portion) 304, and an exemplary embodiment of the bootstrapping circuit 200. The NAND portion 302 of the logic circuit 300 can be configured to perform the logical NAND function and the AND portion 304 of the logic circuit can be configured to perform the logical AND function such that the NAND portion 302 and the AND portion 304 generate complementary outputs in response to a set of input signals. The logic circuit 300 can be an all N-channel CMOS logic circuit formed, for example, by NMOSFET devices or an all P-channel CMOS logic circuit formed by PMOSFET devices. The present embodiment is described with respect to a U-CMOS logic circuit that includes NMOSFET devices and does not include any PMOSFET devices, although those skilled in the art will recognize that exemplary embodiments of the logic circuit 300 can be implemented to include PMOSFET devices and to exclude NMOSFET devices.

The NAND portion 302 can include a logic tree 310 and a logic tree 330. The logic tree 310 includes transistors 312 and 314 arranged in parallel with each other. Each of the transistors 312 and 314 are electrically coupled between a power rail 306 and a circuit node 390. In exemplary embodiments, a voltage, Vdd, can be applied to the power rail 306. A gate terminal 316 of the transistor 312 is driven by an input signal, $\overline{A}$, and a gate terminal 318 of the transistor 314 is driven by an input signal, $\overline{B}$.

The logic tree 330 of the NAND portion 302 includes transistors 332 and 334 arranged in series with each other. The transistor 332 is electrically coupled to node 390 and to the transistor 334, which is electrically coupled between the transistor 332 and a power rail 308. In exemplary embodiments, the power rail 308 can be electrically coupled to ground. A gate terminal 336 of the transistor 332 is driven by an input signal, A, and a gate terminal 338 of the transistor 334 is driven by an input signal, B. The input signal, $\overline{A}$, is complementary to the input signal, A, such that when the input signal, A, is high (i.e. a logic '1'), the input signal, $\overline{A}$, is low (i.e. a logic '0'). The input signal, $\overline{B}$, is complementary to the input signal, B, such that when the input signal, B, is high (i.e. a logic '1'), the input signal, $\overline{B}$, is low (i.e. a logic '0'). An output signal, $\overline{OUT}$, of the NAND portion 302 can be output at the circuit node 390.

The AND portion 304 can include a logic tree 350 and a logic tree 370. The logic tree 350 includes transistors 352 and 354 arranged in series with each other. The transistor 352 is electrically coupled to power rail 306 and the transistor 354, which is electrically coupled between the transistor 352 and a circuit node 392. A gate terminal 356 of the transistor 352 is driven by the input signal, A, and a gate terminal 358 of the transistor 354 is driven by the input signal, B.

The logic tree 370 of the AND portion 304 includes transistors 372 and 374 arranged in parallel with each other. Each of the transistors 372 and 374 are electrically coupled between the circuit node 392 and the power rail 308. A gate terminal 376 of the transistor 372 is driven by the input signal, $\overline{A}$, and a gate terminal 378 of the transistor 374 is driven by the input signal, $\overline{B}$. An output signal, OUT, of the AND portion 304 can be output at the circuit node 392. The output signal, $\overline{OUT}$, is complementary to the output signal, OUT, such that when the output signal, OUT, is high (i.e. a logic '1'), the output signal, $\overline{OUT}$, is low (i.e. a logic '0').

The bootstrapping module 200 is described with respect to FIG. 2 and is electrically coupled to the node 390 of the NAND portion 302 and to the node 392 of the AND portion 304, and is configured to compensate the output voltage at the nodes 390 and 392 to overcome the "weak high" or "Vth-loss" problem of conventional U-CMOS logic circuits. In exemplary operation, when the node 390 of the NAND portion 302 is driven to high (i.e. to a logic '1') and the node 392 is driven low (i.e. a logic '0'), the voltage at the node 390 reaches a voltage of Vdd-Vth. The electrical current through the transistors 312, 314, 332, and 334 is at the OFF current level, leaving the node 390 floating. The transistor 210 of the bootstrapping module 200 is subsequently turned on due to the voltage at the node 390 (e.g., the gate-to-source voltage of the transistor 210 exceeds the threshold voltage of the transistor 210), and the transistor 230 is turned off as its gate terminal 236 receives a low voltage (logic '0') from the node 284 to trigger the latch. As electrical current flows into the node 280 through transistor 210, the voltage level at the node 280 increases and drives the gate 246 of the transistor 240 to turn the transistor 240 on (e.g., the gate-to-source voltage of the transistor 240 exceeds the threshold voltage of the MOSFET 240). The voltage level at node 284 decreases and turns off the MOSFET 230 (e.g., the gate-to-source voltage of the MOSFET 230 is less than the threshold voltage of the transistor 230). The above described process provides a time delay for increasing the voltage level at the node 280 based on the latching mechanism implemented by the transistors 230 and 240.

As the transistor 230 is turned off, the voltage level at the node 280 is pulled up by the transistor 210 to be at least Vdd-2Vth. During the rise in voltage at the node 280, the voltage at the node 390 is boosted to a value that is higher than Vdd-Vth due to the capacitive coupling between the nodes 390 and 280 through the capacitor 250. For the AND portion 304, the voltage at the node 392 is reduced by pull-down transistors 372 and 374.

When the node 390 is driven to a low voltage level (i.e. a logic '0'), the node 392 is driven high voltage level (i.e. a logic '1'). The bootstrapping process for the AND portion is similar to the description above. For example, in exemplary operation, when the node 392 of the AND portion 304 is driven to high (i.e. to a logic '1') and the node 390 is driven low (i.e. a logic '0'), the voltage at the node 392 reaches a voltage of Vdd-Vth. The electrical current through the transistors 352, 354, 372, and 374 is at the OFF current level, leaving the node 392 floating. The transistor 220 of the bootstrapping module 200 is subsequently turned on due to the voltage at the node 392 (e.g., the gate-to-source voltage of the transistor 220 exceeds the threshold voltage of the transistor 220), and the transistor 240 is turned off as its gate terminal 246 receives a low voltage (logic '0') from the node 280 to trigger the latch. As electrical current flows into the node 284 through transistor 220, the voltage level at the node 284 increases and drives the gate 236 of the transistor 230 to turn the transistor 230 on (e.g., the gate-to-source voltage of the transistor 230 exceeds the threshold voltage of the MOSFET 230). The voltage level at node 280 decreases and turns off the MOSFET 240 (e.g., the gate-to-source voltage of the MOSFET 240 is less than the threshold voltage of the transistor 240). The above described process provides a time delay for increasing the voltage level at the node 284 based on the latching mechanism implemented by the transistors 230 and 240.

As the transistor 240 is turned off, the voltage level at the node 284 is pulled up by the transistor 220 to be at least Vdd-2Vth. During the rise in voltage at the node 284, the voltage at the node 392 is boosted to a value that is higher than Vdd-Vth due to the capacitive coupling between the nodes 392 and 284 through the capacitor 260. For the NAND portion 302, the voltage at the node 390 is reduced by pull-down transistors 332 and 334.

Figure 4A:
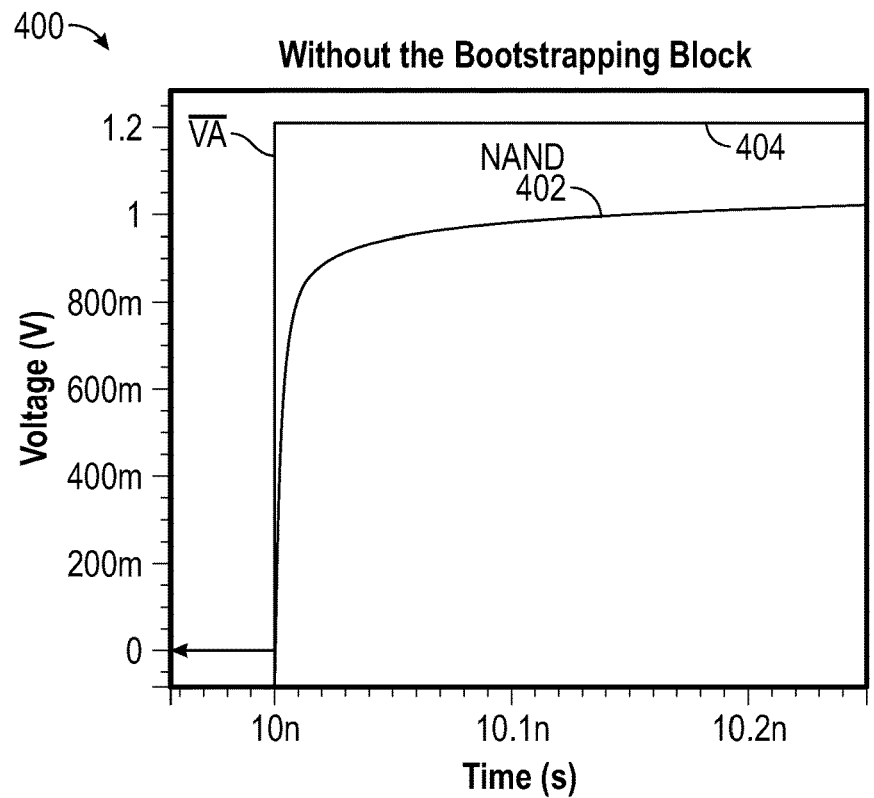
FIG. 4A is a graph illustrating an output signal from a NAND logic circuit without the bootstrapping circuit of the present disclosure.

FIG. 4A is a graph 400 showing an output voltage curve 402 at node 390 in FIG. 3 when the node 390 is driven to a high voltage level (i.e., a logic '1') and the bootstrapping module 200 is not included in the logic circuit 300. The x-axis represents time and the y-axis represents voltage. An ideal step curve 404 is provided on the graph 400, which represents a step transition from a low voltage level of zero volts (e.g. ground) to a high voltage level of 1.2 volts (e.g., Vdd). As shown in FIG. 4A, when the node 390 is driven high, the voltage at the node increases to about 1 volt at steady state, where the difference of 0.2 volts at steady state between the curves 402 and 404 represents the threshold voltage associated with the transistor 312 and/or 314 such that the steady state voltage of the node 390 is at most Vdd-Vth when the bootstrapping module is not utilized.

Figure 4B:
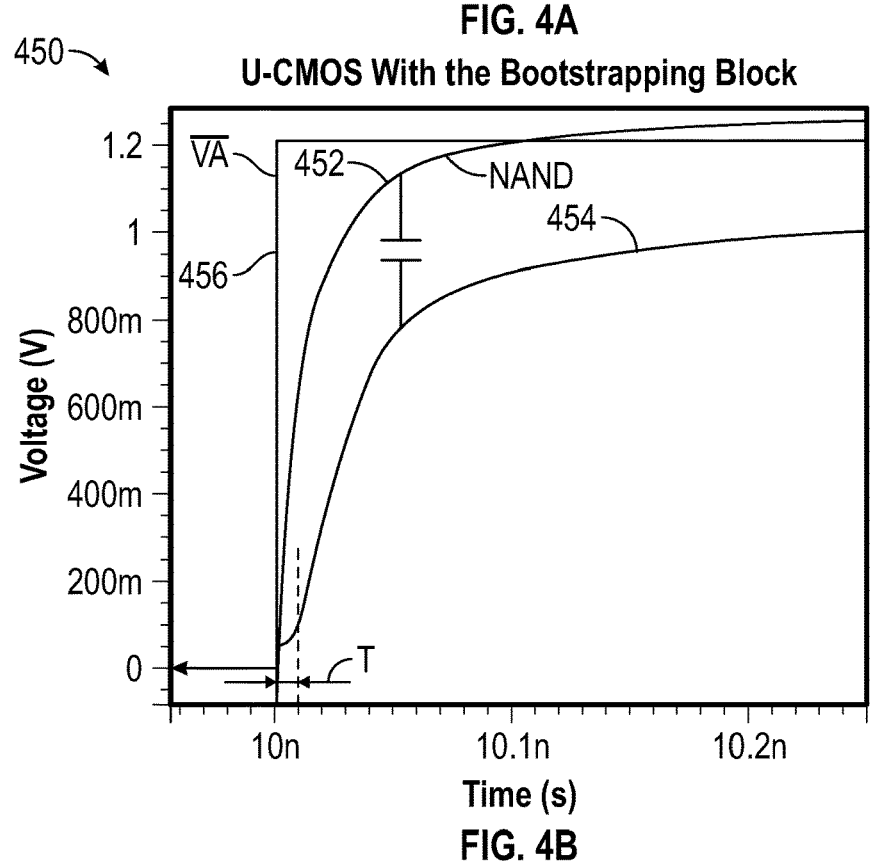
FIG. 4B is a graph illustrating an output signal from a NAND logic circuit that includes the bootstrapping circuit in accordance with exemplary embodiments of the present disclosure.

FIG. 4B is a graph 450 showing an output voltage curve 452 at node 390 in FIG. 3 and the out voltage curve 454 at node 280 when the node 390 is driven to a high voltage level (i.e., a logic '1') and the bootstrapping module 200 is included in the logic circuit 300. The x-axis represents time and the y-axis represents voltage. An ideal step curve 456 is provided on the graph 450, which represents a step transition from a low voltage level of zero volts (e.g. ground) to a high voltage level of 1.2 volts (e.g., Vdd). As shown in FIG. 4A, when the node 390 is driven high, the voltage at the node increases and is boosted by the voltage at node 280 to about 1.2 volts at steady state by the capacitive coupling provided by capacitor 250, such that the steady state voltage of the node 390 is approximately Vdd when the bootstrapping module is utilized. As shown in FIG. 4B, there is a time delay T before the voltage at the node 280 increases substantially, which results in a delayed boosting of the voltage at the node 390.

Figure 5A:
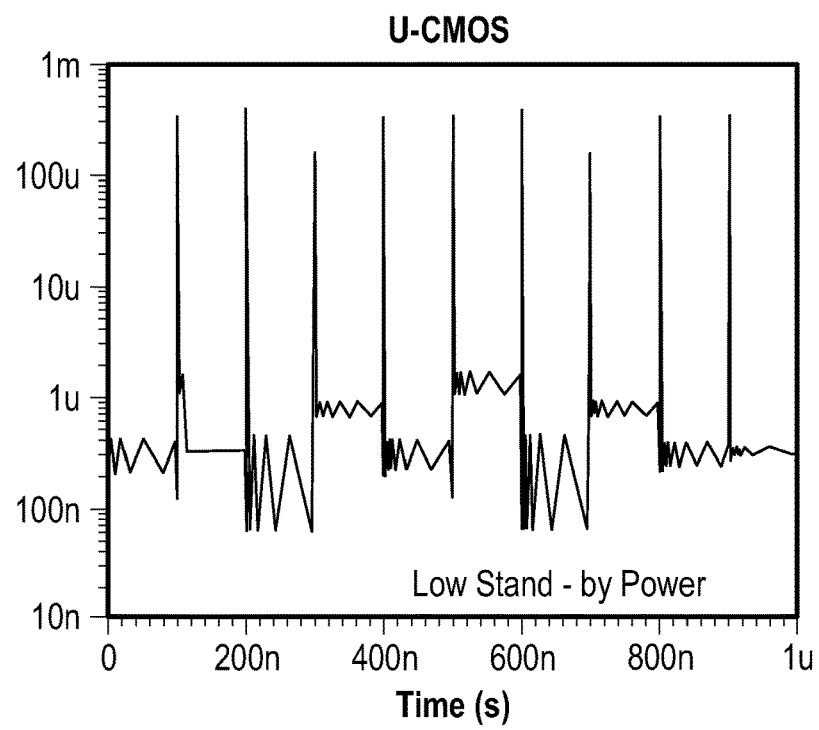
FIGS. 5A-C are graphs showing a stand-by power associated various logic circuits in accordance with the present disclosure.
Figure 5B:
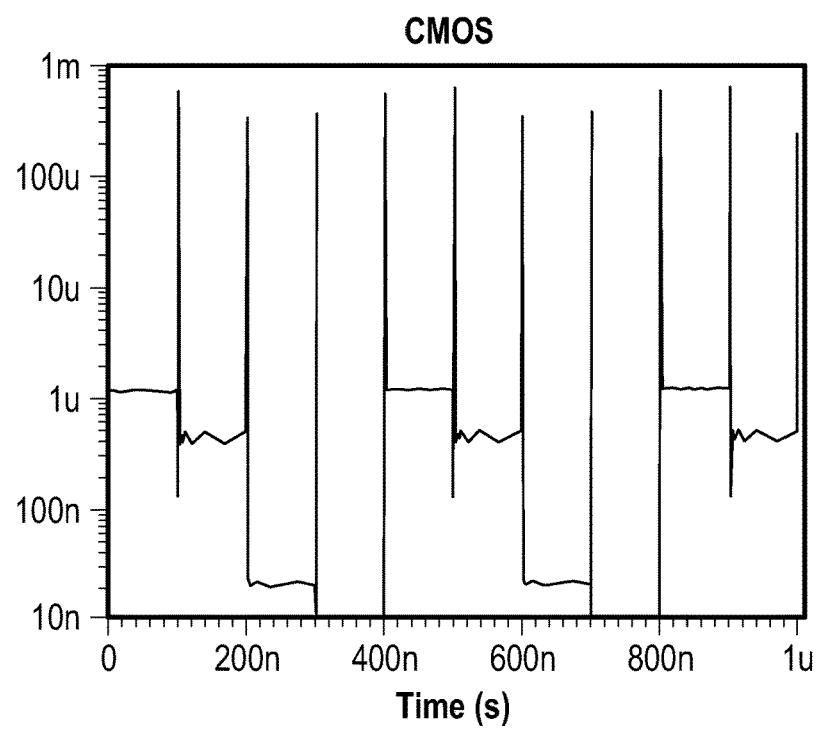
Figure 5C:
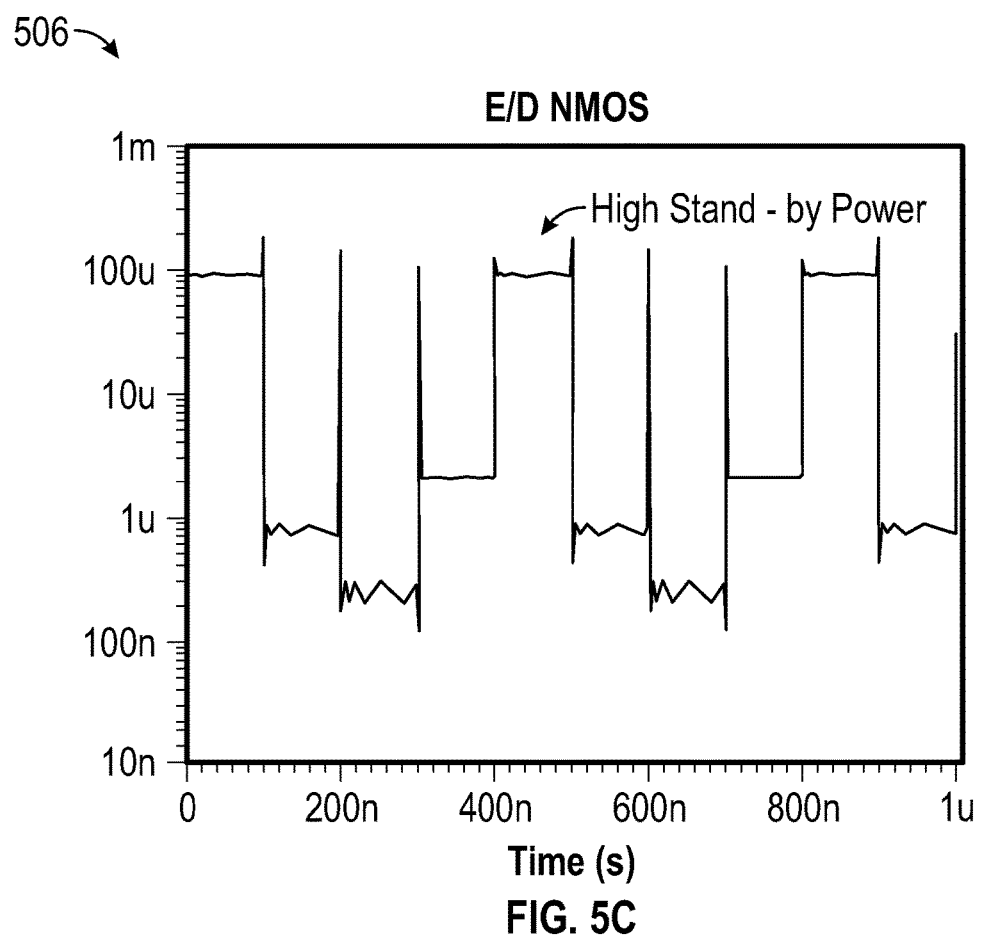

FIGS. 5A-C are graphs 502, 504, and 506, respectively, showing a comparison of exemplary standby currents for different implementations of NAND/AND logic circuits. FIG. 5A corresponds to a standby current for a U-CMOS NAND/AND logic circuit, such as an embodiment of the logic circuit 300. FIG. 5B corresponds to a standby current of a conventional CMOS NAND/AND logic circuit (e.g., a circuit that utilized both NMOSFETS and PMOSFETS). FIG. 5C corresponds to a depletion mode NMOSFET NAND/AND logic circuit (e.g., a circuit that utilizes only depletion mode NMOSFETS). For each of the graphs, the x-axis represents time and the y-axis represents electrical current. As shown in FIGS. 5A and 5B, the U-CMOS logic circuit and the CMOS logic circuit have comparable standby currents of approximately 0.5 microamperes to approximately 1 microampere, while the depletion mode NMOS logic circuit (FIG. 5C) has a higher standby current of approximately one hundred microamperes.

Figure 6:
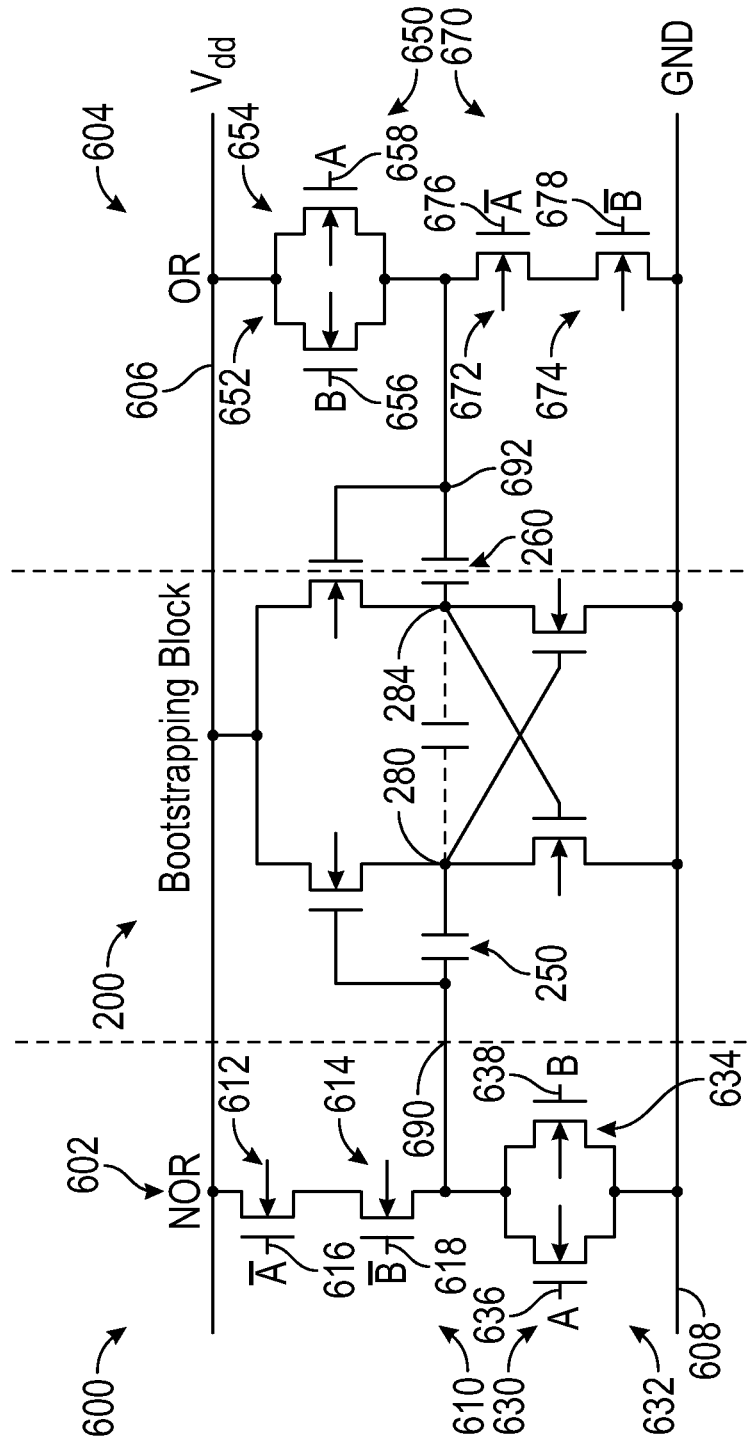
FIG. 6 is a circuit diagram of an exemplary embodiment of a NOR/OR logic circuit including an exemplary bootstrapping circuit in accordance with the present disclosure.

FIG. 6 is a circuit diagram of a NOR/OR U-CMOS logic circuit 600 in accordance with exemplary embodiments of the present disclosure. The logic circuit 600 can includes a NOR portion 602, an OR portion 604, and an embodiment of the bootstrapping module 200. The structure and operation of the present embodiment of the logic circuit 600 is substantially similar to the logic circuit 300, except that the inputs to the logic circuit 600 and the logic circuit 300 differ to facilitate the NOR and OR logic functions via logic circuit 600. The NOR portion 602 of the logic circuit 600 can be configured to perform the logical NOR function and the OR portion 604 of the logic circuit can be configured to perform the logical OR function such that the NOR portion 602 and the OR portion 604 generate complementary outputs in response to a set of input signals. The logic circuit 600 can be an all N-channel CMOS logic circuit formed, for example, by NMOSFET devices or an all P-channel CMOS logic circuit formed by PMOSFET devices. The present embodiment is described with respect to a U-CMOS logic circuit that includes NMOSFET devices and does not include any PMOSFET devices, although those skilled in the art will recognize that exemplary embodiments of the logic circuit 600 can be implemented to include PMOSFET devices and to exclude NMOSFET devices.

The NOR portion 602 can include a logic tree 610 and a logic tree 630. The logic tree 610 of the NOR portion 602 includes transistors 612 and 614 arranged in series with each other. The transistor 614 is electrically coupled to node 690 and to the transistor 612, which is electrically coupled between the transistor 614 and a power rail 606. In exemplary embodiments, a voltage, Vdd, can be applied to the power rail 606. A gate terminal 616 of the transistor 612 is driven by an input signal, $\overline{A}$, and a gate terminal 618 of the transistor 614 is driven by an input signal, $\overline{B}$.

The logic tree 630 includes transistors 632 and 634 arranged in parallel with each other. Each of the transistors 632 and 634 are electrically coupled between a power rail 608 and the circuit node 690. In exemplary embodiments, ground can be applied to the power rail 608. A gate terminal 636 of the transistor 632 is driven by an input signal, A, and a gate terminal 638 of the transistor 634 is driven by an input signal, B. The input signal, $\overline{A}$, is complementary to the input signal, A, such that when the input signal, A, is high (i.e. a logic '1'), the input signal, $\overline{A}$, is low (i.e. a logic '0'). The input signal, $\overline{B}$, is complementary to the input signal, B, such that when the input signal, B, is high (i.e. a logic '1'), the input signal, $\overline{B}$, is low (i.e. a logic '0'). An output signal, $\overline{OUT}$, of the NOR portion 602 can be output at the circuit node 690.

The OR portion 604 can include a logic tree 650 and a logic tree 670. The logic tree 650 of the OR portion 604 includes transistors 652 and 654 arranged in parallel with each other. Each of the transistors 652 and 654 are electrically coupled between the circuit node 692 and the power rail 606. A gate terminal 656 of the transistor 652 is driven by the input signal, A, and a gate terminal 658 of the transistor 654 is driven by the input signal, B.

The logic tree 670 includes transistors 672 and 674 arranged in series with each other. The transistor 674 is electrically coupled to power rail 608 and the transistor 672, which is electrically coupled between the transistor 674 and the circuit node 692. A gate terminal 676 of the transistor 672 is driven by the input signal, $\overline{A}$, and a gate terminal 678 of the transistor 674 is driven by the input signal, $\overline{B}$. An output signal, OUT, of the OR portion 604 can be output at the circuit node 692. The output signal, $\overline{OUT}$, is complementary to the output signal, OUT, such that when the output signal, OUT, is high (i.e. a logic '1'), the output signal, $\overline{OUT}$, is low (i.e. a logic '0').

The bootstrapping module 200 is described with respect to FIG. 2 and is electrically coupled to the node 690 of the NOR portion 602 and to the node 692 of the NOR portion 604. The node 690 is capacitively coupled to the node 280 of the bootstrapping module via the capacitor 250 and the node 692 is capacitively coupled to the node 284 via the capacitor 260. The boot strapping module 200 is configured to compensate the output voltage at the nodes 690 and 692 to overcome the "weak high" or "Vth-loss" problem of conventional U-CMOS logic circuits. As described herein, in an exemplary operation, when the node 690 of the NOR portion 602 is driven to high (i.e. to a logic '1') and the node 692 is driven low (i.e. a logic '0'), the voltage at the node 690 is boosted by the bootstrapping module 200 as described herein, so that the voltage at the node 690 is approximately the supply voltage, Vdd, as opposed to Vdd-Vth. Likewise, in an exemplary operation, when the node 692 of the NOR portion 604 is driven to high (i.e. to a logic '1') and the node 690 is driven low (i.e. a logic '0'), the voltage at the node 692 is boosted by the bootstrapping module 200 as described herein so that the voltage at the node 692 is approximately the supply voltage, Vdd, as opposed to Vdd-Vth.

Figure 7:
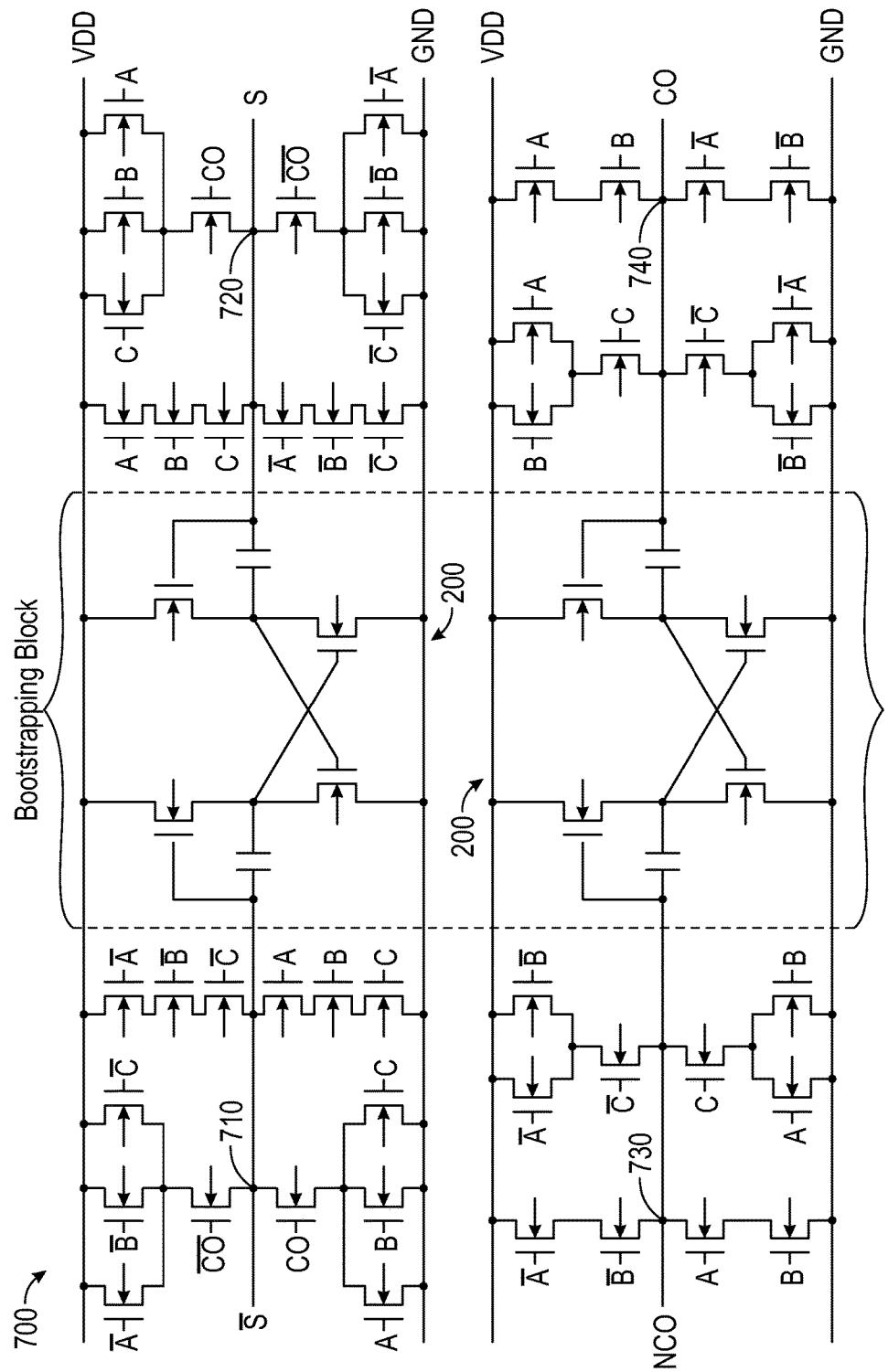
FIG. 7 is a circuit diagram of an exemplary embodiment of a full adder circuit including an exemplary bootstrapping circuit in accordance with the present disclosure.
Figure 8A:
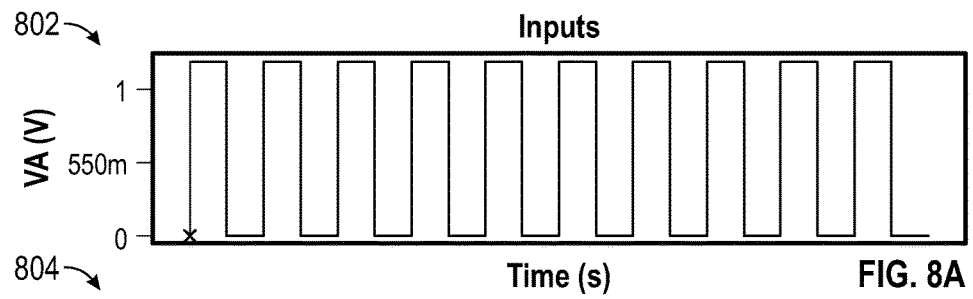
FIGS. 8A-E are graphs of various input and output waveforms for the full adder circuit of FIG. 7 to show an effect of the bootstrapping module on the full adder circuit in accordance with exemplary embodiments of the present disclosure.
Figure 8B:
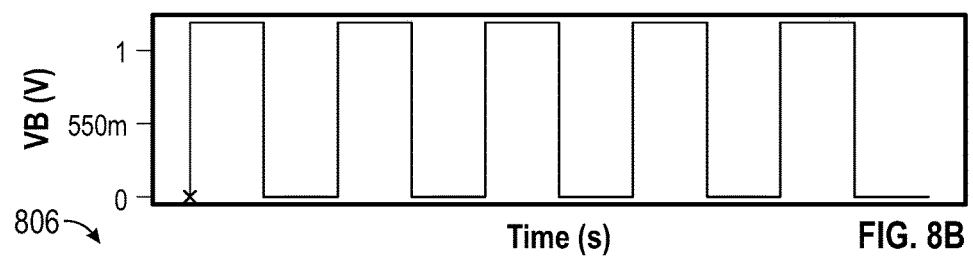
Figure 8C:
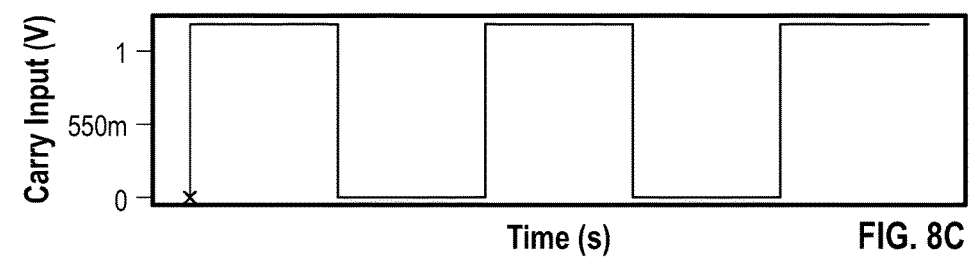
Figure 8D:
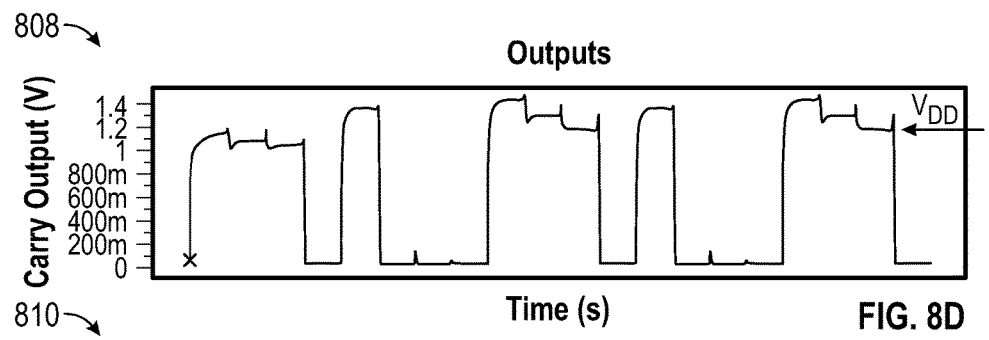
Figure 8E:
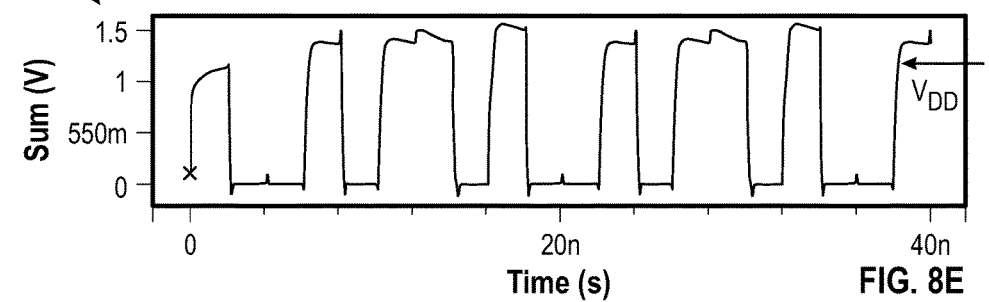

FIG. 7 is a circuit diagram of an exemplary embodiment of a full adder circuit including an exemplary bootstrapping circuit in accordance with the present disclosure. As shown in FIG. 7, the full adder circuit can include nodes 710, 720, 730, and 740, each of which can be driven high (i.e. to a logic '1') or low (i.e. to a logic '0'). The nodes 710 and 720 form a complementary pair of nodes, such that when the node 710 is high, the node 720 is low and vice versa. Likewise, the nodes 730 and 740 form a complementary pair of node, such that when the node 730 is high, the node 740 is low and vice versa. A first instance of the bootstrapping module 200 can be electrically coupled between the nodes 710 and 720 so that the node 710 is capacitively coupled to the node 280 via the capacitor 250 and the node 720 is capacitively coupled to the node 284. A second instance of the bootstrapping module 200 can be coupled between the output nodes 730 and 740 so that the node 730 is capacitively coupled to the node 280 via the capacitor 250 and the node 740 is capacitively coupled to the node 284. The instances of the bootstrapping module 200 can operate as described herein to provide a boosted voltage to the nodes 710, 720, 730, and 740 when the voltage at any of the output nodes is pulled-up by the transistors of the full adder circuit 700. FIGS. 8A-E are graphs 802, 804, 806, 808, and 810 of various input and output waveforms for the full adder 700 of FIG. 7 to show an effect of the bootstrapping module 200 on the full adder circuit 700.

Figure 9:
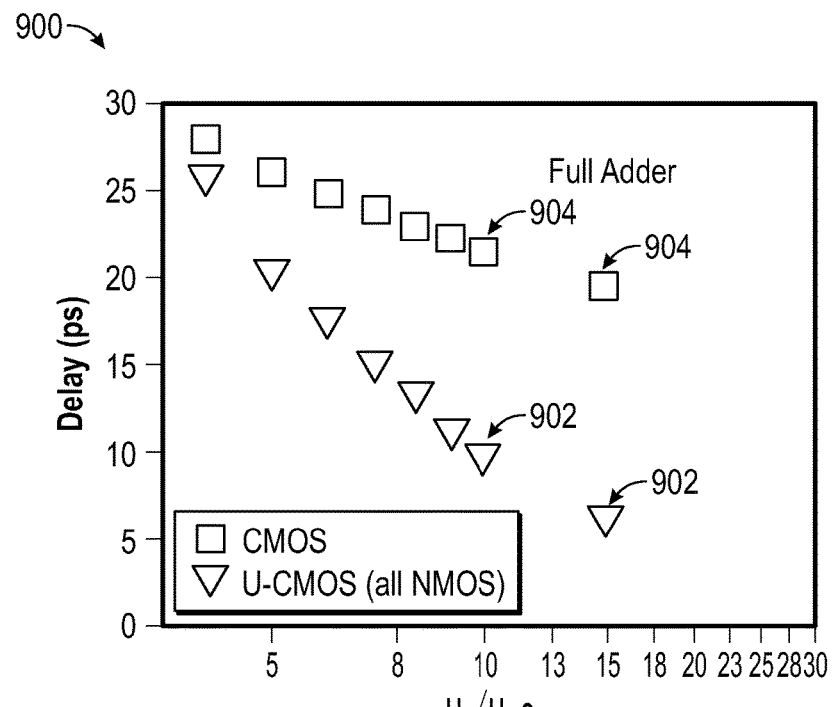
FIG. 9 is a graph showing a comparison of delays between a conventional CMOS full adder circuit and a U-CMOS full adder circuit.

FIG. 9 is a graph 900 showing a simulated comparison of delays 902 and 904 between a conventional CMOS full adder circuit and a U-CMOS full adder circuit using only NMOSFET devices, respectively. The x-axis represents the electron mobility enhancement ratio and the y-axis represent time delay. As shown in FIG. 9, the U-CMOS full adder circuit is generally subject to shorter time delays that the conventional CMOS full adder, and the difference between the time delays of the U-CMOS full adder circuit and the CMOS full adder circuit increases as the electron mobility enhancement ratio increases. As shown by FIG. 9, the conventional CMOS circuit is hindered by the low hole mobility. The delay for the conventional CMOS full adder circuit improves by less than a factor of 1.5, due to the low hole mobility, even after increasing the electron mobility by 10 times that in Si, as it is likely in some InGaAs NMOSFETs. In contrast, the advantage of the high electron mobility can be fully realized by the use of the U-CMOS logic with the bootstrapping block.

Figure 10:
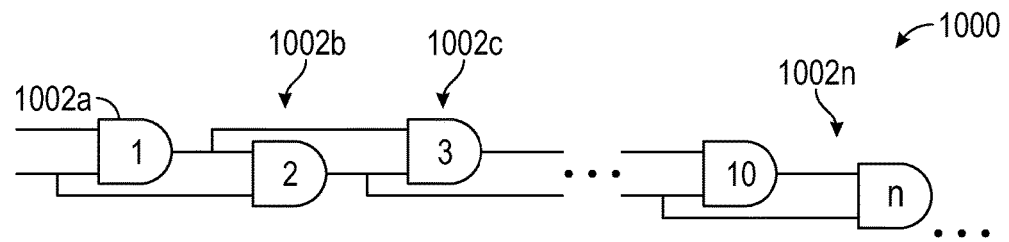
FIG. 10 is a circuit diagram showing unipolar AND logic gates connected in series in accordance with exemplary embodiments of the present disclosure.
Figure 11A:
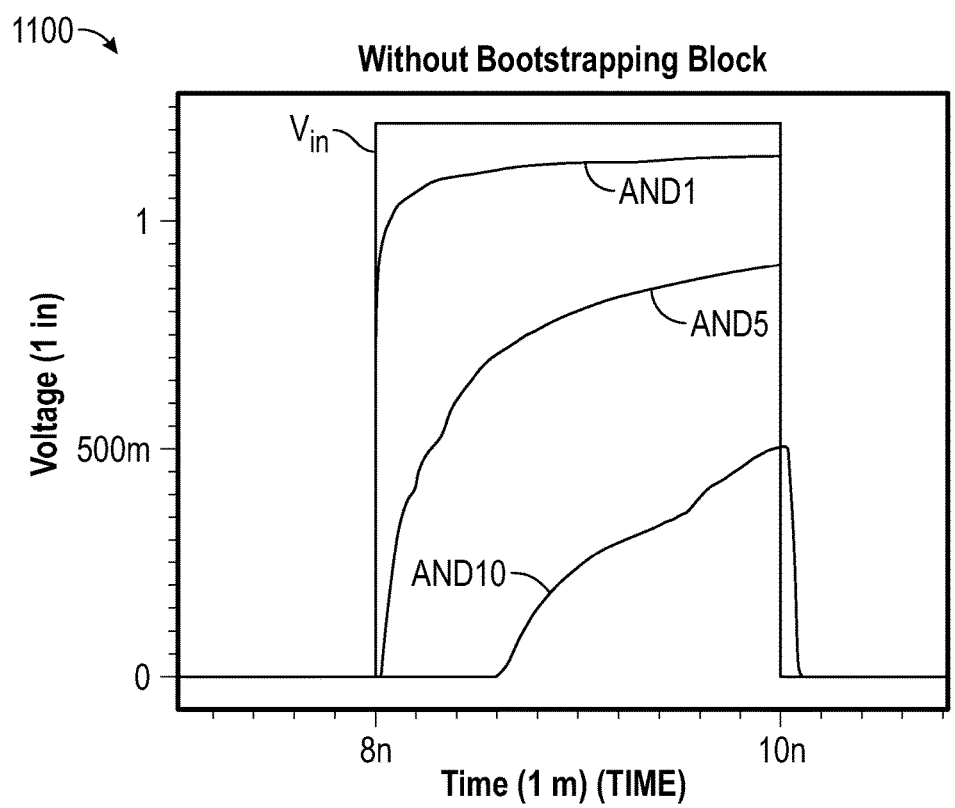
FIGS. 11A-B are graphs showing an effect of the bootstrapping module in a series of AND gates in accordance with exemplary embodiments of the present disclosure.
Figure 11B:
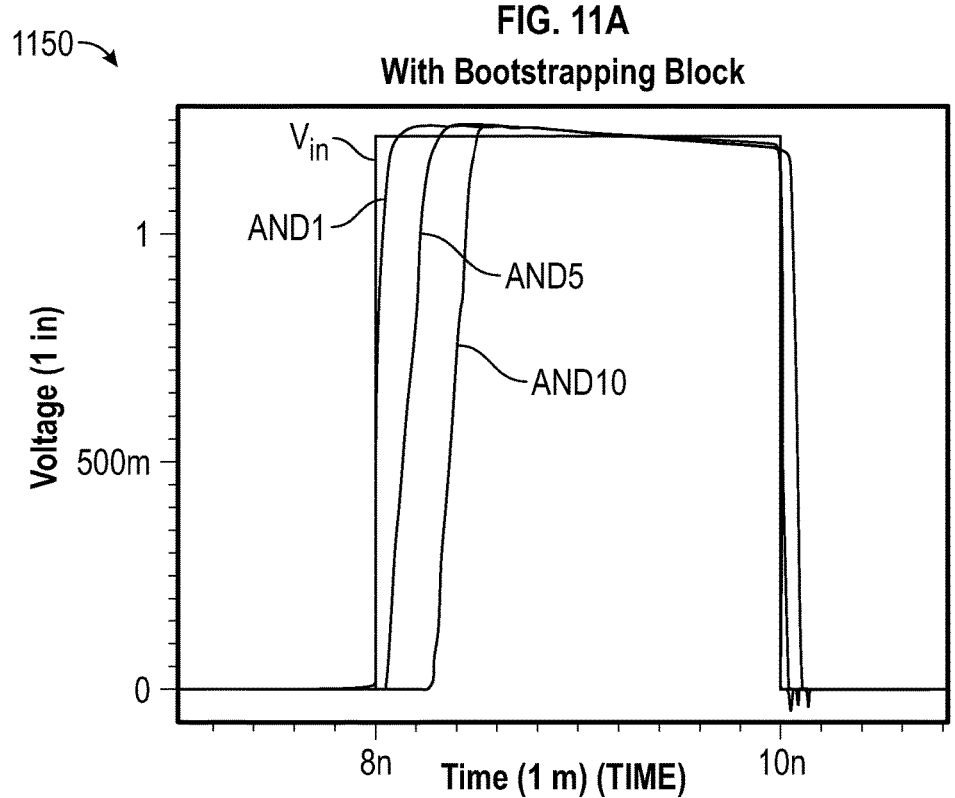

FIG. 10 is a circuit diagram depicting a circuit 1000 including multiple U-CMOS AND gates 1002a-n connected in series. The U-CMOS AND gates can be formed an exemplary embodiment of the logic circuit 300. FIGS. 11A and 11B are graphs 1100 and 1150, respectively, illustrating the effects of an embodiment of the bootstrapping module 200 on the output voltage of the AND gates. FIG. 11A shows the outputs of the first, fifth, and tenth AND gates in the circuit 1000 when the bootstrapping module 200 is utilized and FIG. 11B shows the outputs of the first, fifth, and tenth AND gates when the bootstrapping module 200 is not utilized. As shown in FIG. 11B, the outputs of the first, fifth, and tenth AND gates can each be driven high to be approximately equal to the supply voltage, Vdd, of 1.2 volts, while in FIG. 11 A an implementation of the AND gates without the bootstrapping module 200 shows that the output voltage of the AND gates decreases as the signal propagates through the AND gates such that the first AND gate is approximately a threshold voltage (Vth) below the supply voltage, the fifth AND gate is approximately half of the supply voltage, and the tenth AND gate is approximately one third of the supply voltage.

Figure 12:
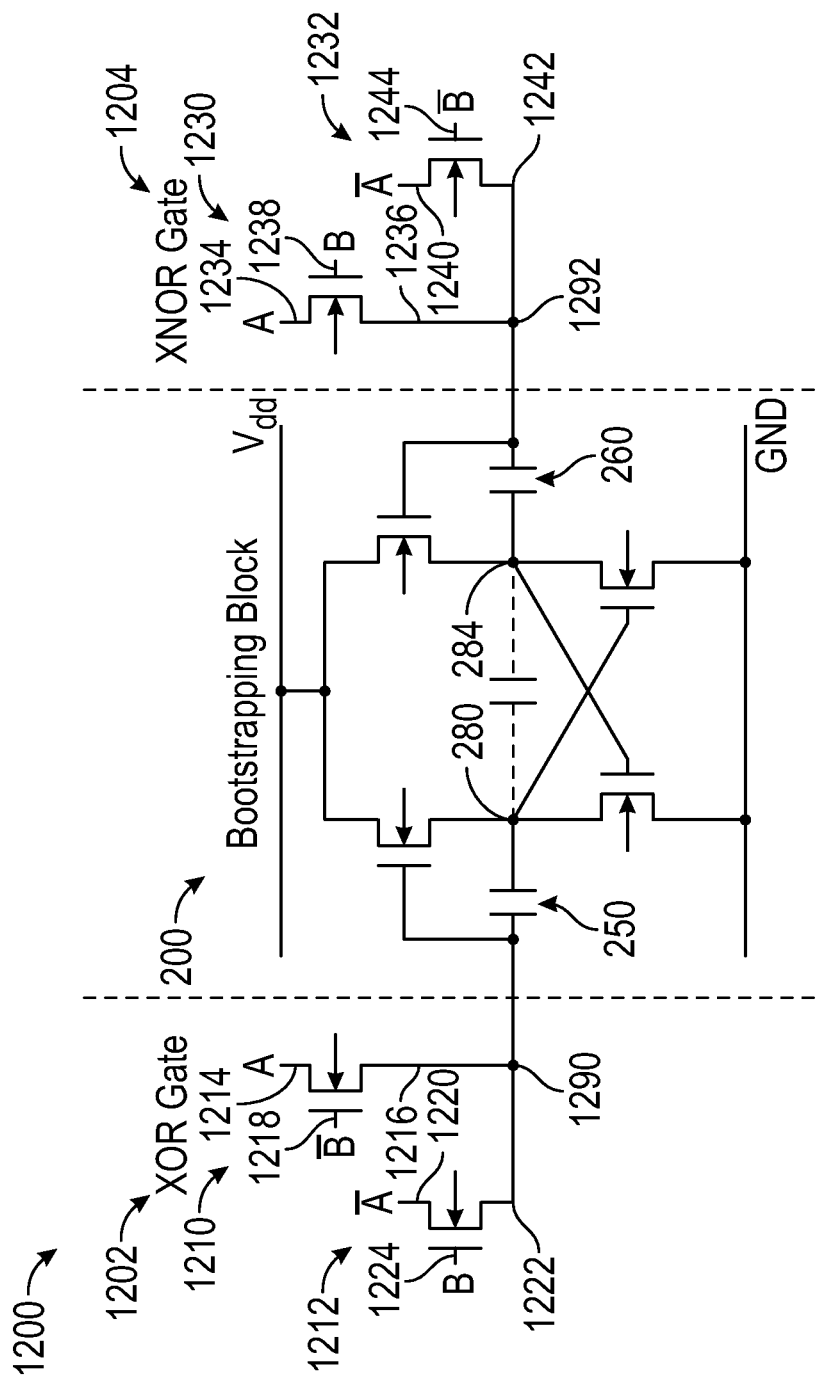
FIG. 12 is a circuit diagram of an exemplary embodiment of a pass-gate XOR/XNOR logic circuit including an exemplary bootstrapping circuit in accordance with the present disclosure.

FIG. 12 is a circuit diagram of a pass-gate XOR/XNOR logic circuit 1200. The logic circuit includes an XOR portion 1202, an XNOR portion 1204, and an exemplary embodiment of the bootstrapping module 200. The XOR portion 1202 is configured to perform an exclusive OR logic function. The XNOR portion 1204 is configured to perform an exclusive NOR logic function. The logic circuit 1200 can be an all N-channel CMOS logic circuit formed, for example, by NMOSFET devices or an all P-channel CMOS logic circuit formed by PMOSFET devices. The present embodiment is described with respect to a U-CMOS logic circuit that includes NMOSFET devices and does not include any PMOSFET devices, although those skilled in the art will recognize that exemplary embodiments of the logic circuit 1200 can be implemented to include PMOSFET devices and to exclude NMOSFET devices.

As shown in FIG. 12, the XOR portion 1202 includes a transistor 1210 and a transistor 1212. The transistor 1210 includes a drain terminal 1214, a source terminal 1216, and a gate terminal 1218. The transistor 1212 includes a drain terminal 1220, a source terminal 1222, and a gate terminal 1224. The source terminals 1216 and 1222 are each electrically coupled to a node 1290. The drain terminal of the transistor 1210 is configured to receive an input signal, A, and the drain terminal is configured to receive an input signal, $\overline{A}$, which is complementary to the input signal, A. The gate terminal 1224 of the transistor 1212 is configured to receive an input signal, B, and the gate terminal 1218 is configured to receive an input signal, $\overline{B}$, which is complementary to the input signal, B.

The XNOR portion 1204 includes a transistor 1230 and a transistor 1232. The transistor 1230 includes a drain terminal 1234, a source terminal 1236, and a gate terminal 1238. The transistor 1232 includes a drain terminal 1240, a source terminal 1242, and a gate terminal 1244. The source terminals 1236 and 1242 are each electrically coupled to a node 1292. The drain terminal 1234 of the transistor 1230 is configured to receive the input signal, A, and the drain terminal 1240 is configured to receive the input signal, $\overline{A}$, which is complementary to the input signal, A. The gate terminal 1238 of the transistor 1230 is configured to receive the input signal, B, and the gate terminal 1244 is configured to receive the input signal, $\overline{B}$, which is complementary to the input signal, B.

The bootstrapping module 200 is described with respect to FIG. 2 and is electrically coupled to the node 1290 of the XOR portion 1202 and to the node 1292 of the XNOR portion 1204. The node 1290 is capacitively coupled to the node 280 of the bootstrapping module via the capacitor 250 and the node 1292 is capacitively coupled to the node 284 via the capacitor 260. The boot strapping module 200 is configured to compensate the output voltage at the nodes 1290 and 1292 to overcome the "weak high" or "Vth-loss" problem of conventional pass-gate U-CMOS logic circuits. As described herein, in an exemplary operation, when the node 1290 of the XOR portion 1202 is driven to high (i.e. to a logic '1') and the node 1292 is driven low (i.e. a logic '0'), the voltage at the node 1290 is boosted by the bootstrapping module 200 as described herein so that the voltage at the node 1290 is approximately the supply voltage, Vdd, as opposed to Vdd-Vth. Likewise, in an exemplary operation, when the node 1292 of the XNOR portion 1204 is driven to high (i.e. to a logic '1') and the node 1290 is driven low (i.e. a logic '0'), the voltage at the node 1292 is boosted by the bootstrapping module 200 as described herein so that the voltage at the node 1292 is approximately the supply voltage, Vdd, as opposed to Vdd-Vth.

Figure 13A:
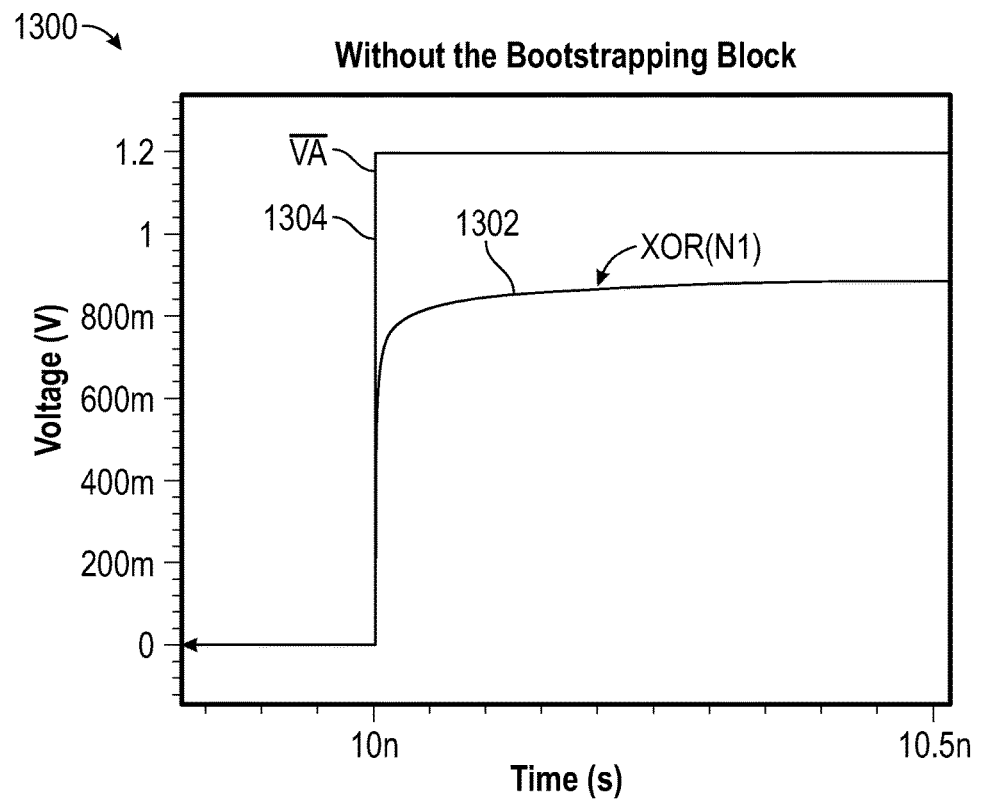
FIG. 13A is a graph illustrating an output signal from a XOR logic circuit in response to an input signal without the bootstrapping circuit.

FIG. 13A is a graph 1300 showing an output voltage curve 1302 at node 1290 in FIG. 12 when the node 1290 is driven to a high voltage level (i.e., a logic '1') by one of the transistors 1210 and 1212 and the bootstrapping module 200 is not included in the logic circuit 1200. The x-axis represents time and the y-axis represents voltage. An ideal step curve 1304 is provided on the graph 1300, which represents a step transition from a low voltage level of zero volts (e.g. ground) to a high voltage level of 1.2 volts (e.g., Vdd). As shown in FIG. 13A, when the node 1290 is driven high, the voltage at the node increases to about 0.9 volts at steady state such that the steady state voltage of the node 1290 is at most Vdd-Vth when the bootstrapping module is not utilized.

Figure 13B:
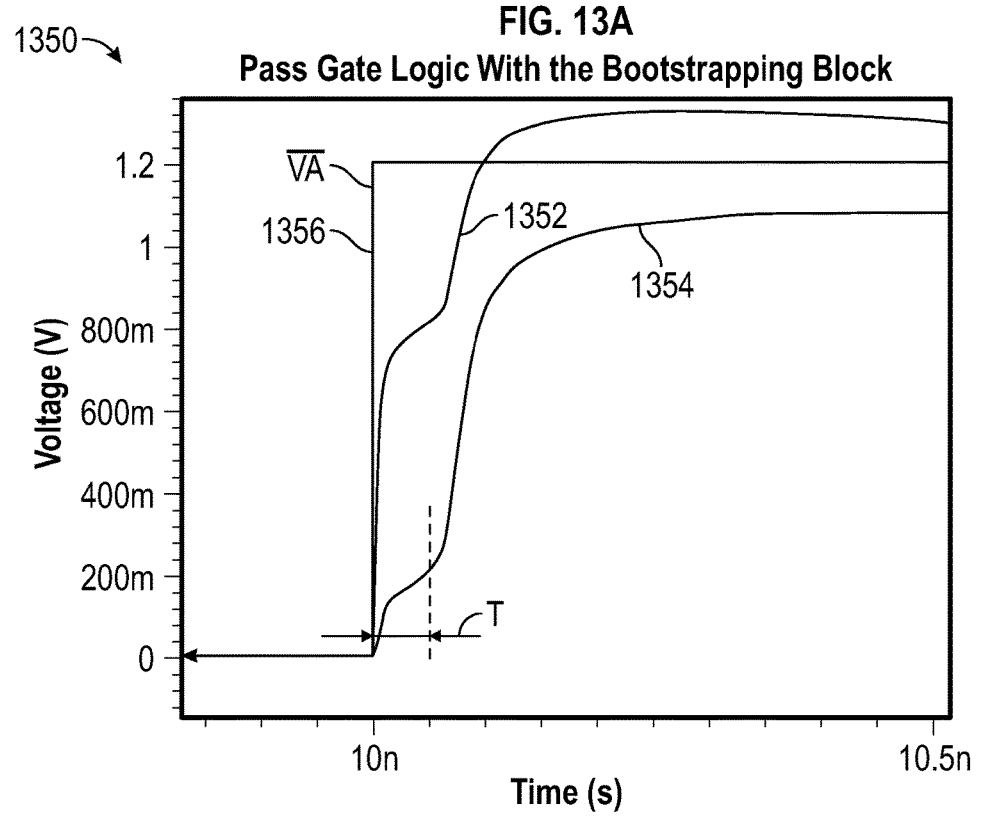
FIG. 13B is a graph illustrating an output signal from a XOR logic portion of FIG. 12 in response to an input signal.

FIG. 13B is a graph 1350 showing an output voltage curve 1352 at node 1290 in FIG. 12 and the out voltage curve 1354 at node 280 when the node 1290 is driven to a high voltage level (i.e., a logic '1') and the bootstrapping module 200 is included in the logic circuit 1200. The x-axis represents time and the y-axis represents voltage. An ideal step curve 1356 is provided on the graph 1350, which represents a step transition from a low voltage level of zero volts (e.g. ground) to a high voltage level of 1.2 volts (e.g., Vdd). As shown in FIG. 12, when the node 1290 is driven high, the voltage at the node increases and is boosted by the voltage at node 280 to about 1.2 volts at steady state by the capacitive coupling provided by capacitor 250, such that the steady state voltage of the node 1290 is approximately Vdd when the bootstrapping module is utilized. As shown in FIG. 13B, there is a time delay T before the voltage at the node 280 increases substantially, which results in a delayed boosting of the voltage at the node 1290.

The foregoing description of the specific embodiments of the subject matter disclosed herein has been presented for purposes of illustration and description and is not intended to limit the scope of the subject matter set forth herein. It is fully contemplated that other various embodiments, modifications and applications will become apparent to those of ordinary skill in the art from the foregoing description and accompanying drawings. Thus, such other embodiments, modifications, and applications are intended to fall within the scope of the following appended claims. Further, those of ordinary skill in the art will appreciate that the embodiments, modifications, and applications that have been described herein are in the context of particular environment, and the subject matter set forth herein is not limited thereto, but can be beneficially applied in any number of other manners, environments and purposes. Accordingly, the claims set forth below should be construed in view of the full breadth and spirit of the novel features and techniques as disclosed herein.

What is claimed is:

1. A logic circuit comprising:
a logic module configured to output a logic value at a first circuit node in response to one or more input values;
a complementary logic module configured to output a complementary logic value at a second circuit node compared to the logic value output by the logic module at the first circuit node; and
a bootstrapping module capacitively coupled to the first circuit node, the bootstrapping module configured to contribute to a voltage at the first circuit node based on the logic value being output by the first logic module, the bootstrapping module comprising:
a first pull-up transistor having a first terminal electrically coupled to a first power rail, a second terminal, and a third terminal that is capacitively coupled to the second terminal and electrically coupled to the first circuit node;
a second pull-up transistor having a first terminal electrically coupled to a first power rail, a second terminal, and a third terminal that is capacitively coupled to the second terminal and electrically coupled to the second circuit node, the second pull-up transistor being arranged in a parallel circuit configuration with the first pull-up transistor; and
a latch circuit electrically coupled to the second terminals of the first and second pull-up transistors to control a voltage at the second terminals.

2. The circuit of claim 1, wherein the bootstrapping module is responsive to a voltage at the first circuit node and to a voltage at a second circuit node that represents a complementary logic value to the logic value associated with the voltage at the first circuit node.

3. The circuit of claim 1, wherein the logic module and the bootstrapping module include a plurality of transistors, each of the plurality of transistors having a single channel type.

4. The circuit of claim 1, wherein the single channel type is an N-channel MOSFET or a P-channel MOSFET.

5. The circuit of claim 1, wherein the latch circuit comprises:
a first pull-down transistor having a first terminal, a second terminal, and a third terminal, wherein the first terminal of the first pull-down transistor is electrically coupled to the second terminal of the first pull-up transistor, the second terminal of the first pull-down transistor is electrically coupled to a second power rail, and the third terminal is electrically coupled to the second terminal of the second pull-up transistor.

6. The circuit of claim 5, wherein the latch circuit further comprises:
a second pull-down transistor having a first terminal, a second terminal, and a third terminal, wherein the first terminal of the second pull-down transistor is electrically coupled to the second terminal of the second pull-up transistor, the second terminal of the second pull-down transistor is electrically coupled to the second power rail, and the third terminal of the second pull-down transistor is electrically coupled to the second terminal of the first pull-up transistor.

7. A logic circuit comprising:
a logic module configured to output a logic value at a first circuit node in response to one or more input values; and
a bootstrapping module capacitively coupled to the first circuit node, the bootstrapping module configured to contribute to a voltage at the first circuit node based on the logic value being output by the first logic module, wherein the logic module is at least one of a logic NAND gate, a logic AND gate, a logic OR gate, a logic NOR gate, an exclusive OR gate, or an exclusive NOR gate.

8. A logic circuit comprising:
a logic module configured to output a logic value at a first circuit node in response to one or more input values; and
a bootstrapping module capacitively coupled to the first circuit node, the bootstrapping module configured to contribute to a voltage at the first circuit node based on the logic value being output by the first logic module, wherein the logic module comprises a portion of a full adder circuit.

9. An integrated circuit comprising:
a unipolar logic circuit including a first plurality of transistors of a single channel type, the unipolar logic circuit having a first circuit node and a second circuit node, the first and second circuit nodes are configured to provide complementary logic values in response to a set of input signals; and
a bootstrapping module including a second plurality of transistors of the single channel type, the bootstrapping module being capacitively coupled to the first and second nodes and being configured to contribute to a voltage at the first circuit node based on the complementary logic values at the first and second nodes,
wherein the unipolar logic circuit includes at least one of a logic NAND gate, a logic AND gate, a logic OR gate, a logic NOR gate, an exclusive OR gate, or an exclusive NOR gate.

10. The circuit of claim 9, wherein the bootstrapping module comprises:
a first pull-up transistor having a first terminal electrically coupled to a first power rail, a second terminal, and a third terminal that is capacitively coupled to the second terminal and electrically coupled to the first circuit node; and
a second pull-up transistor having a first terminal electrically coupled to a voltage supply, a second terminal, and a third terminal that is capacitively coupled to the second terminal and electrically coupled to the second circuit node, the second pull-up transistor being arranged in a parallel circuit configuration with the first pull-up transistor.

11. The circuit of claim 10, wherein the bootstrapping module further comprises:
a first pull-down transistor having a first terminal, a second terminal, and a third terminal, wherein the first terminal of the first pull-down transistor is electrically coupled to the second terminal of the first pull-up transistor, the second terminal of the first pull-down transistor is electrically coupled to a second power rail, and the third terminal is electrically coupled to the second terminal of the second pull-up transistor.

12. The circuit of claim 11, wherein the bootstrapping module further comprises:
a second pull-down transistor having a first terminal, a second terminal, and a third terminal, wherein the first terminal of the second pull-down transistor is electrically coupled to the second terminal of the second pull-up transistor, the second terminal of the second pull-down transistor is electrically coupled to the second power rail, and the third terminal of the second pull-down transistor is electrically coupled to the second terminal of the first pull-up transistor.

13. A bootstrapping circuit for a dual-rail unipolar logic circuit, the bootstrapping circuit comprising:
a first pull-up transistor having a first terminal electrically coupled to a first power rail, a second terminal, and a third terminal that is capacitively coupled to the second terminal; and
a latch circuit electrically coupled to the second terminal to control a voltage at the second terminal based on a voltage at the third terminal.

14. The circuit of claim 13, wherein a voltage at the second terminal of the first pull-up transistor contributes to a voltage at the third terminal of the first pull-up transistor via a capacitor disposed between the second and third terminals of the first pull-up transistor.

15. The circuit of claim 13, further comprising:
a second pull-up transistor having a first terminal electrically coupled to a voltage supply, a second terminal, and a third terminal that is capacitively coupled to the second terminal, the second pull-up transistor being arranged in a parallel circuit configuration with the first pull-up transistor.

16. The circuit of claim 15, wherein a voltage at the second terminal of the first pull-up transistor contributes to a voltage at the third terminal of the first pull-up transistor via a capacitor disposed between the second and third terminals of the first pull-up transistor.

17. The circuit of claim 15, wherein the latch circuit comprises:
a first pull-down transistor having a first terminal, a second terminal, and a third terminal, wherein the first terminal of the first pull-down transistor is electrically coupled to the second terminal of the first pull-up transistor, the second terminal of the first pull-down transistor is electrically coupled to a second power rail, and the third terminal is electrically coupled to the second terminal of the second pull-up transistor.

18. The circuit of claim 17, wherein the latch circuit further comprises:
a second pull-down transistor having a first terminal, a second terminal, and a third terminal, wherein the first terminal of the second pull-down transistor is electrically coupled to the second terminal of the second pull-up transistor, the second terminal of the second pull-down transistor is electrically coupled to the second power rail, and the third terminal of the second pull-down transistor is electrically coupled to the second terminal of the first pull-up transistor.

19. The integrated circuit of claim 10, wherein the bootstrapping module comprises:
a latch circuit electrically coupled to the second terminals of the first and second pull-up transistors to control a voltage at the second terminals.

20. The logic circuit of claim 7, wherein the logic module is a dual-rail unipolar logic circuit, and the bootstrapping module comprises:
a first pull-up transistor having a first terminal electrically coupled to a first power rail, a second terminal, and a third terminal that is capacitively coupled to the second terminal; and
a latch circuit electrically coupled to the second terminal to control a voltage at the second terminal based on a voltage at the third terminal.

21. The logic circuit of claim 8, wherein the logic module is a dual-rail unipolar logic circuit, and the bootstrapping module comprises:
a first pull-up transistor having a first terminal electrically coupled to a first power rail, a second terminal, and a third terminal that is capacitively coupled to the second terminal; and
a latch circuit electrically coupled to the second terminal to control a voltage at the second terminal based on a voltage at the third terminal.

22. The logic circuit of claim 1, wherein the logic module and the bootstrapping module are statically implemented and are operative without a clock signal.

23. The logic circuit of claim 22, wherein the bootstrapping module is responsive to a voltage at the first circuit node and to a voltage at a second circuit node that represents a complementary logic value to the logic value associated with the voltage at the first circuit node.

24. The logic circuit of claim 9, wherein the unipolar logic circuit and the bootstrapping module are statically implemented and are operative without a clock signal.

* * * * *